(12) United States Patent
Watanabe

(10) Patent No.: US 8,120,437 B2
(45) Date of Patent: Feb. 21, 2012

(54) OSCILLATOR WITH LITTLE DETERIORATION CAPABLE OF OUTPUTTING CLOCK PULSES WITH TARGET FREQUENCY

(75) Inventor: Toru Watanabe, Matsumoto (JP)

(73) Assignee: Seiko Epson Corporation (JP)

( * ) Notice: Subject to any disclaimer, the term of this patent is extended or adjusted under 35 U.S.C. 154(b) by 45 days.

(21) Appl. No.: 12/723,776

(22) Filed: Mar. 15, 2010

(65) Prior Publication Data

US 2010/0244967 A1    Sep. 30, 2010

(30) Foreign Application Priority Data

Mar. 26, 2009  (JP) .................................. 2009-075907

(51) Int. Cl.
*H03B 5/32* (2006.01)
(52) U.S. Cl. ............... 331/158; 331/116 R; 331/116 FE
(58) Field of Classification Search .............. 331/116 R, 331/158, 116 FE
See application file for complete search history.

(56) References Cited

U.S. PATENT DOCUMENTS 7,262,671 B2 *   8/2007   Maeder ......................... 331/183

FOREIGN PATENT DOCUMENTS

JP        2007-111831         5/2007

* cited by examiner

*Primary Examiner* — Arnold Kinkead
(74) *Attorney, Agent, or Firm* — Harness, Dickey & Pierce, P.L.C.

(57) ABSTRACT

An oscillator includes: a vibrator having a first electrode and a second electrode disposed with a gap with the first electrode; a reference voltage supply circuit adapted to supply a reference voltage; and a voltage adjustment circuit having a step-up circuit operating in response to input of clock pulses and adapted to convert the reference voltage into a voltage of a predetermined level and to output the voltage of the predetermined level, wherein the vibrator is configured so as to apply the voltage of the predetermined level, which is output from the voltage adjustment circuit, between the first electrode and the second electrode, and the clock pulses to be input into the step-up circuit are obtained using the vibrator as a source.

8 Claims, 9 Drawing Sheets

OSCILLATOR WITH LITTLE DETERIORATION CAPABLE OF OUTPUTTING CLOCK PULSES WITH TARGET FREQUENCY

BACKGROUND

1. Technical Field

The present invention relates to an oscillator.

2. Related Art

Generally, there is known an oscillator using a micro electro-mechanical system (MEMS) technology, and having an MEMS element provided to a semiconductor substrate. In such an oscillator, the MEMS element is used as a vibrator, and a clock pulse with a target frequency is output to an external circuit or the like.

As the MEMS element used for the vibrator of the oscillator, there is known an element having, for example, a fixed electrode and a movable electrode, the movable electrode vibrating in accordance with application of a specific alternating-current voltage between these electrodes (e.g., JP-A-2007-111831). Further, the specific alternating-current voltage generally has the natural resonant frequency (hereinafter referred to as a resonant frequency) of the movable electrode.

As such an oscillator, the oscillator shown in FIGS. 10A and 10B, for example, can be cited. The oscillator shown in FIGS. 10A and 10B is composed of an oscillation circuit composed of an MEMS vibrator and an active circuit, a bias voltage applying circuit for applying a bias voltage to the MEMS vibrator, and a buffer circuit for preventing the mutual interference between the oscillator and an external circuit.

The vibrator provided to such an oscillator has a characteristic that the resonant frequency varies when a static voltage (a bias voltage) applied between the movable electrode and the fixed electrode is varied. It should be noted that the bias voltage is generally a direct-current voltage. Therefore, it is possible to adjust the bias voltage to be applied, thereby adjusting the resonant frequency. Since such a vibrator is very tiny, it is difficult to manufacture the vibrator so as to have the resonant frequency falling within the target range with good accuracy. However, by appropriately adjusting the bias voltage, it is possible to make the resonant frequency fall within the target range.

Further, in the case in which the resonant frequency of the vibrator due to the bias voltage is sufficiently small with respect to the bias voltage which can be applied, the vibrator has the characteristic that the fluctuation range of the frequency increases as the bias voltage becomes higher. Therefore, in the case in which the frequency fluctuation range of the vibrator needs to be broadened, a high bias voltage might be intentionally applied to the vibrator.

Further, the appropriate bias voltage of the vibrator (the MEMS element) is determined in accordance with the shape and the form of the vibrator, and the voltage higher than the drive voltage of the active circuit of the oscillator might be required depending on the shape. Although in most cases the operation voltage of the active circuit of the oscillation circuit is set to be a relatively low value (e.g., 3V), in the case in which the appropriate value of the bias voltage exceeds the value (e.g., 5 through 10V), it becomes necessary to add a step-up circuit.

As the oscillator for making the resonant frequency fall within the target range, or for broadening the frequency fluctuation range of the vibrator, an oscillator having a configuration shown in FIG. 11, for example, can be cited. In the case of using such an oscillator, it becomes possible to control the oscillating frequency of the oscillation circuit by the bias voltage applied thereto.

The oscillator shown in FIG. 11 is composed of a reference voltage supply circuit for supplying the reference voltage, a step-up circuit for converting the reference voltage into a higher voltage, an oscillation circuit for applying the voltage thus stepped up, to the vibrator and obtaining clock pulses from the vibration of the vibrator to thereby output the clock pulse to the external circuit, and a buffer circuit for preventing the mutual interference between the oscillator and the external circuit.

As described above, the step-up circuit for stepping up the bias voltage might be used in order for applying the appropriate bias voltage, or for broadening the fluctuation range of the resonant frequency of the vibrator. As the step-up circuit, a charge pump circuit is preferably used. The charge pump circuit has a relatively small area, and can be incorporated on, for example, a semiconductor substrate, and is therefore suitable for miniaturization of the oscillator. However, the charge pump circuit operates by the clock pulses obtained from the outside. Therefore, in the case in which the clock pulses of an external quartz oscillator or the like are used in the charge pump circuit, since the clock pulses of the quartz oscillator or the like do not necessarily have a frequency equal to that of the oscillator or the vibrator (the MEMS element), there is concern that the problem of deterioration (e.g., increase in noise) of the clock pulses transmitted from the oscillator due to the interference arises. If the clock pulses transmitted from the oscillator are thus deteriorated, failure might be caused in the external circuit such as a microcomputer or a controller using the clock pulses output from the oscillator.

SUMMARY

An advantage of the invention is to provide an oscillator with little deterioration capable of outputting clock pulses with a target frequency.

The advantage described above is obtained by the following aspects of the invention.

According to an aspect of the invention, there is provided an oscillator including a vibrator having a first electrode and a second electrode disposed with a gap with the first electrode, a reference voltage supply circuit adapted to supply a reference voltage, and a voltage adjustment circuit having a step-up circuit operating in response to input of clock pulses and adapted to convert the reference voltage into a voltage of a predetermined level and to output the voltage of the predetermined level, wherein the vibrator is configured so as to apply the voltage of the predetermined level, which is output from the voltage adjustment circuit, between the first electrode and the second electrode, and the clock pulses to be input into the step-up circuit are obtained using the vibrator as a source.

Thus, an oscillator with little deterioration capable of outputting clock pulses with a target frequency can be provided.

According to another aspect of the invention, in the oscillator of the above aspect of the invention, it is preferable that the first electrode is a fixed electrode, and the second electrode is a movable electrode.

Thus, an oscillator with less deterioration capable of outputting clock pulses with a target frequency can be provided.

According to another aspect of the invention, in the oscillator of the above aspect of the invention, it is preferable that a level of the voltage output from the voltage adjustment circuit is adjusted to be the predetermined level, thereby setting a resonant frequency of the vibrator to be within a predetermined numerical range.

Thus, an oscillator with little deterioration capable of outputting clock pulses with a target frequency can be provided.

According to another aspect of the invention, in the oscillator of the above aspect of the invention, it is preferable that an oscillation circuit adapted to generate the clock pulses based on the vibration of the vibrator, and to output the clock pulses to the step-up circuit and an outside is further provided.

Thus, an oscillator with little deterioration capable of outputting clock pulses with a target frequency can be provided.

According to another aspect of the invention, in the oscillator of the above aspect of the invention, it is preferable that a buffer circuit disposed between the oscillation circuit and the step-up circuit, and adapted to transmit the clock pulses is further provided.

Thus, the operation of the step-up circuit can be prevented from exerting an influence on generation of the clock pulses of the oscillation circuit.

According to another aspect of the invention, in the oscillator of the above aspect of the invention, it is preferable that the voltage adjustment circuit has a voltage divider circuit, the voltage divider circuit converts the reference voltage into a lower voltage and outputs the lower voltage to the step-up circuit, and the step-up circuit converts the voltage, which is input from the voltage divider circuit, into a higher voltage, and outputs the higher voltage as the voltage of the predetermined level.

Thus, it becomes easier to adjust the level of the voltage applied to the vibrator.

According to another aspect of the invention, in the oscillator of the above aspect of the invention, it is preferable that the voltage adjustment circuit has a voltage divider circuit, the step-up circuit converts the reference voltage into a higher voltage and outputs the higher voltage to the voltage divider circuit, and the voltage divider circuit converts the voltage, which is input from the step-up circuit, into a lower voltage, and outputs the lower voltage as the voltage of the predetermined level.

Thus, it becomes easier to adjust the level of the voltage applied to the vibrator.

According to another aspect of the invention, in the oscillator of the above aspect of the invention, it is preferable that a frequency divider circuit adapted to divide frequency of the clock pulses obtained using the vibrator as a source, and to input the clock pulses with the divided frequency into the step-up circuit is further provided.

Thus, if the frequency of the clock pulses generated by the vibrator is too high for the step-up circuit to operate preferably, the step-up circuit can operate preferably by dividing the frequency before using the clock pulses.

BRIEF DESCRIPTION OF THE DRAWINGS

The invention will now be described with reference to the accompanying drawings, wherein like numbers reference like elements.

DESCRIPTION OF EXEMPLARY EMBODIMENTS

Hereinafter, an oscillator of the invention will be explained in detail based on the embodiments shown in the accompanying drawings.

First Embodiment

Figure 1:
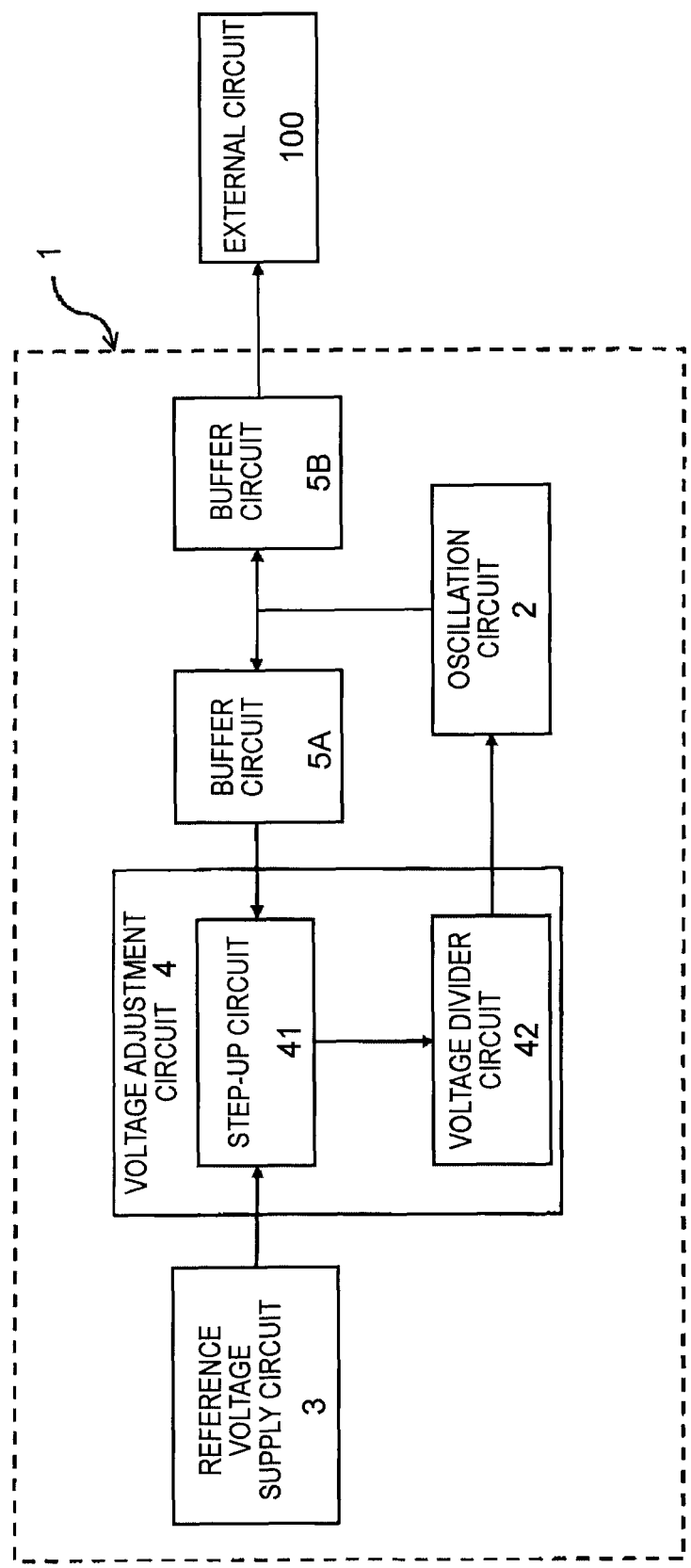
FIG. 1 is a block diagram of an oscillator according to a first embodiment of the invention.
Figure 2:
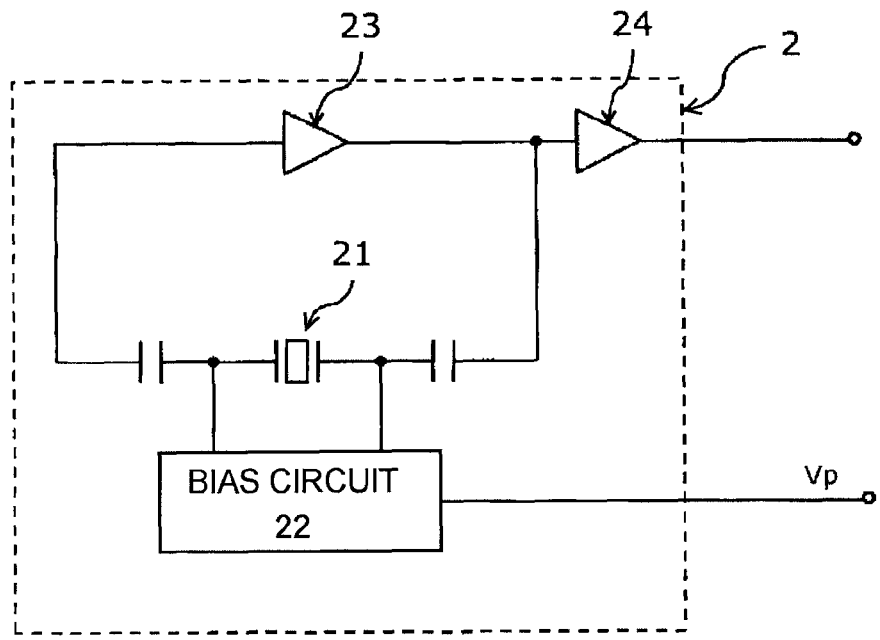
FIG. 2 is a circuit diagram of an oscillation circuit provided to the oscillator shown in FIG. 1.
Figure 3:
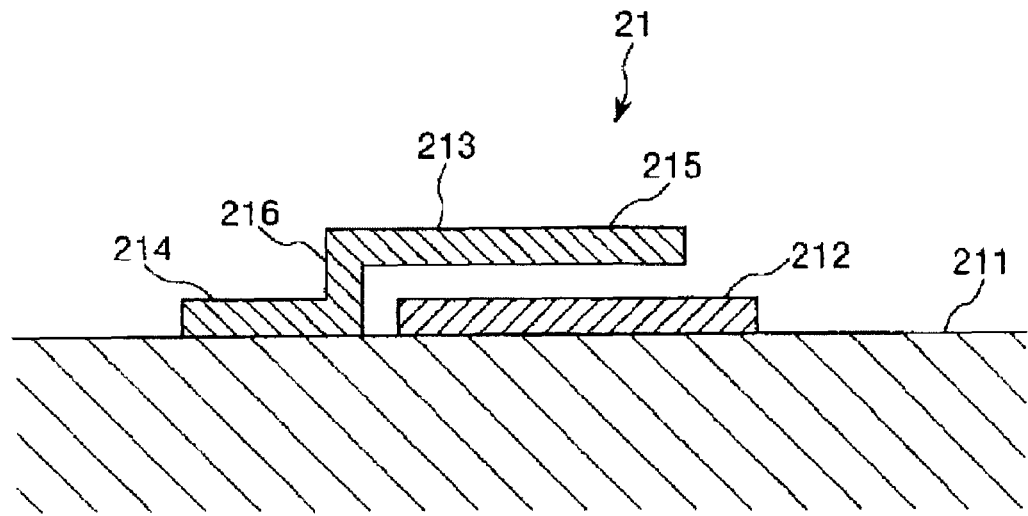
FIG. 3 is a schematic cross-sectional diagram of a vibrator provided to the oscillation circuit shown in FIG. 2.
Figure 4:
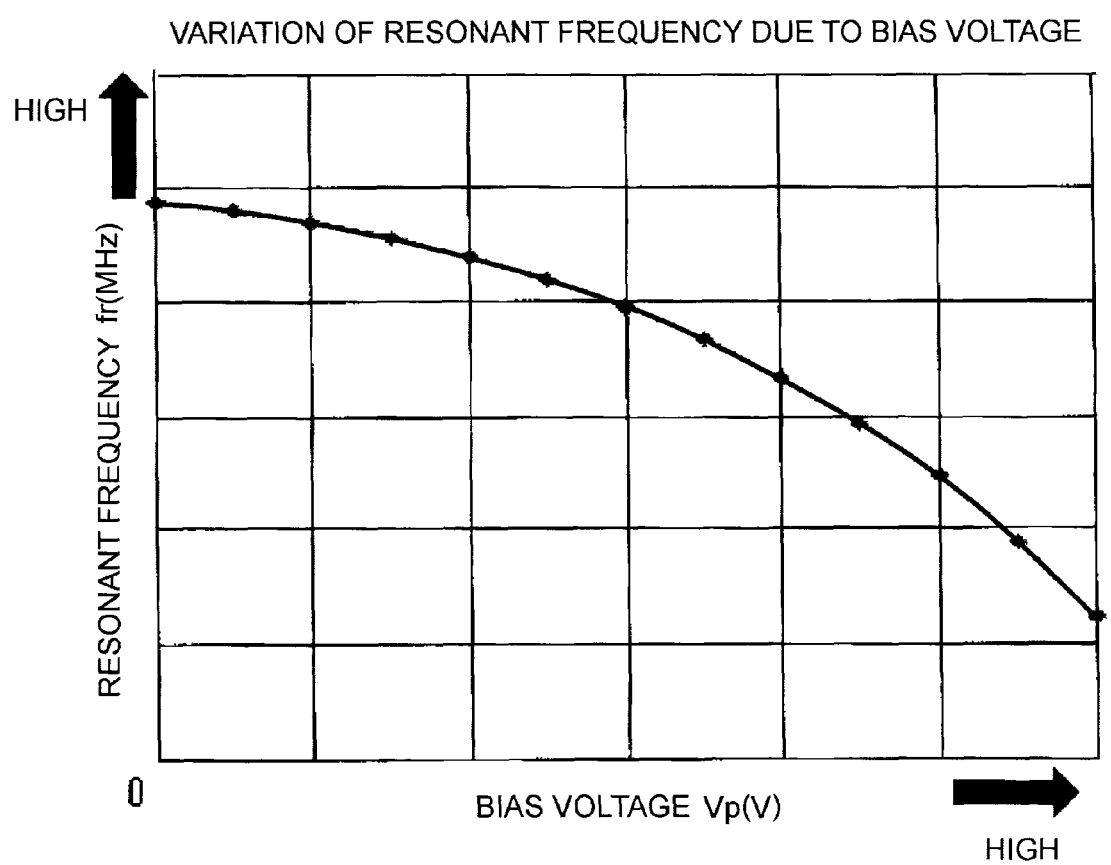
FIG. 4 is a graph showing a relationship between the resonant frequency of the vibrator shown in FIG. 3 and a bias voltage applied to the vibrator.
Figure 5:
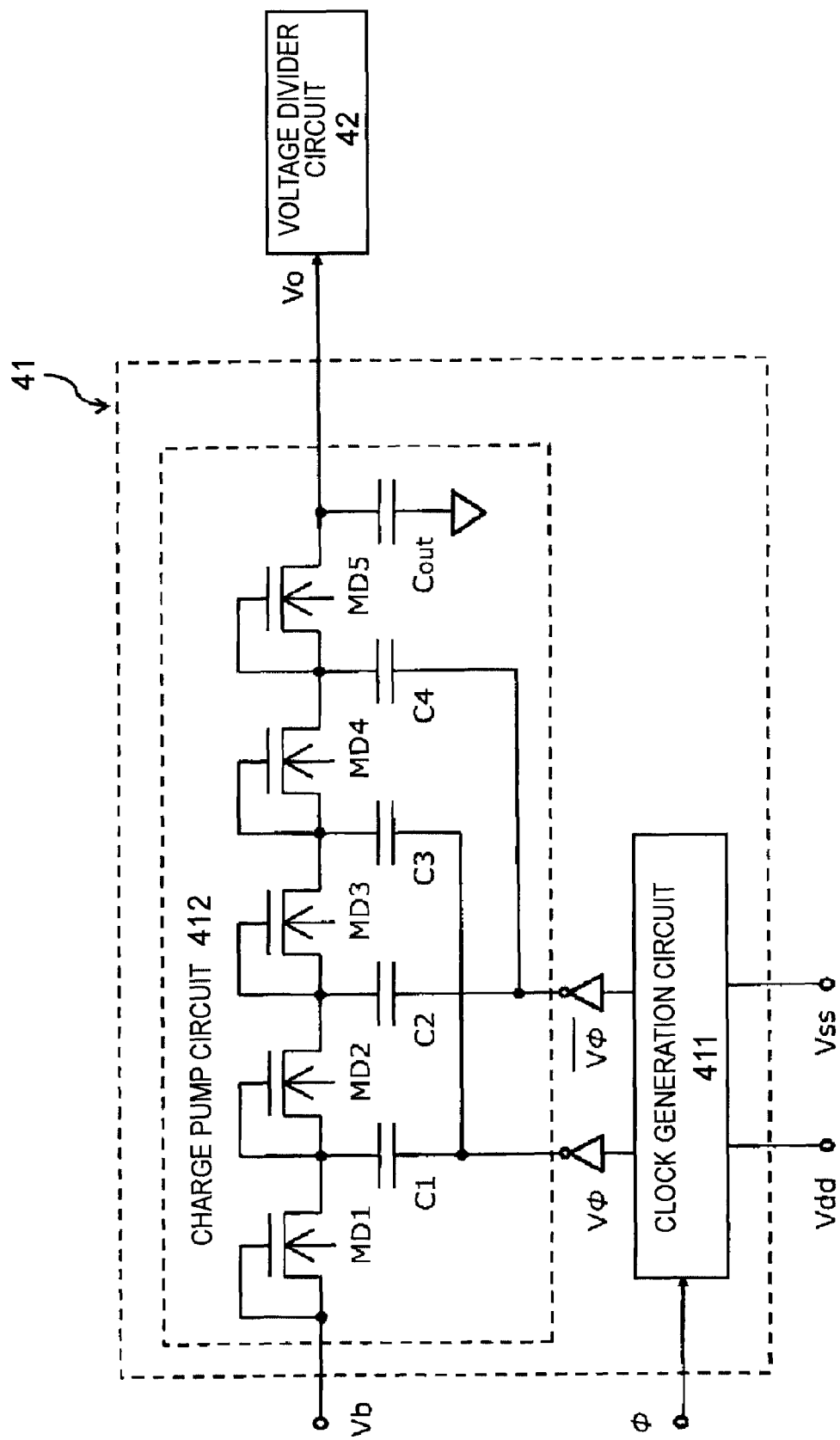
FIG. 5 is a circuit diagram of a step-up circuit provided to the oscillator shown in FIG. 1.
Figure 6:
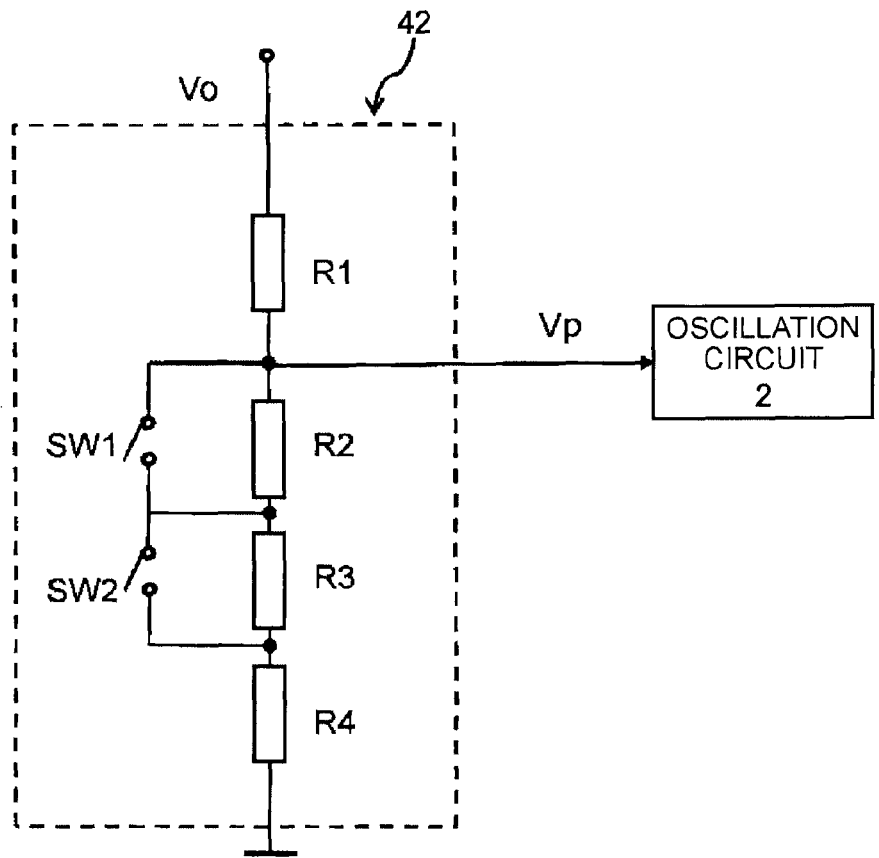
FIG. 6 is a circuit diagram of a voltage divider circuit provided to the oscillator shown in FIG. 1.
Figure 7:
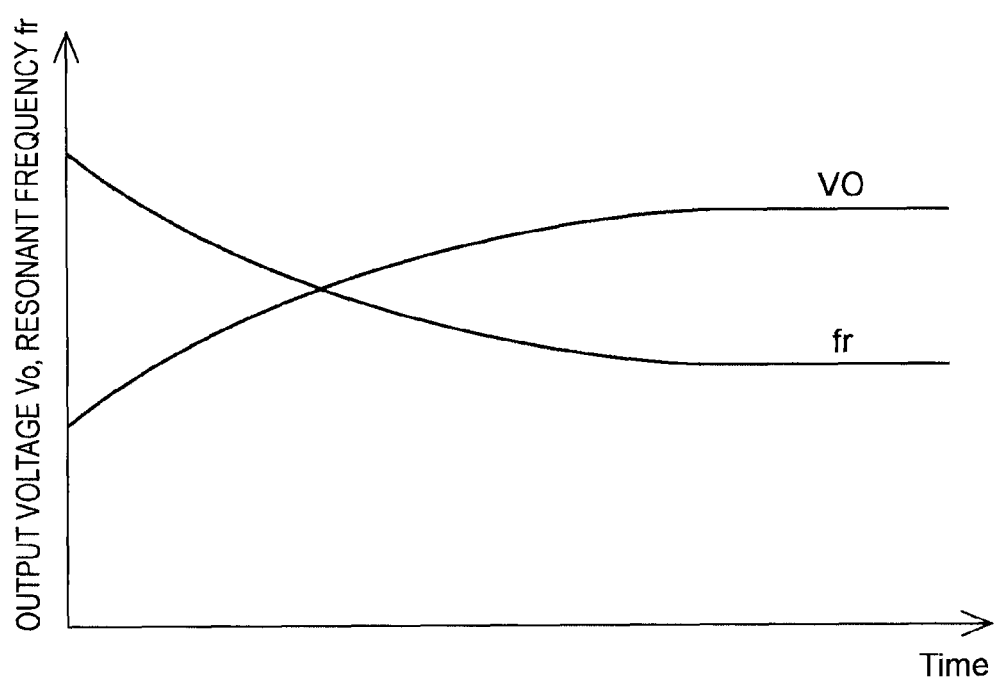
FIG. 7 is a graph showing temporal variations of the output voltage of the step-up circuit and the resonant frequency of the vibrator when the oscillator shown in FIG. 1 starts the operation.

FIG. 1 is a block diagram of an oscillator according to the first embodiment of the invention, FIG. 2 is a circuit diagram of the oscillation circuit provided to the oscillator shown in FIG. 1, FIG. 3 is a schematic cross-sectional diagram of a vibrator provided to the oscillation circuit shown in FIG. 2, FIG. 4 is a graph showing a relationship between the resonant frequency of the vibrator shown in FIG. 3 and a bias voltage applied to the vibrator, FIG. 5 is a circuit diagram of a step-up circuit provided to the oscillator shown in FIG. 1, FIG. 6 is a circuit diagram of a voltage divider circuit provided to the oscillator shown in FIG. 1, and FIG. 7 is a graph showing temporal variations of the output voltage of the step-up circuit and the resonant frequency of the vibrator when the oscillator shown in FIG. 1 starts the operation. It should be noted that the upper side of FIGS. 1 through 7 is referred to as an "upper side," the lower side thereof is referred to as a "lower side," the right side thereof is referred to as a "right side," and the left side thereof is referred to as a "left side" in the following descriptions for the sake of convenience of explanations.

The oscillator 1 shown in FIG. 1 has an oscillation circuit 2, a reference voltage supply circuit 3, a voltage adjustment circuit 4, and buffer circuits 5A, 5B.

In such an oscillator 1, clock pulses with a predetermined frequency are generated in the oscillation circuit 2, and the clock pulses are output from the oscillator 1 to an external circuit 100. Further, the oscillator 1 is generally disposed on a semiconductor substrate as, for example, an electronic circuit in an IC chip.

Hereinafter, each of the sections of the oscillator 1 will be explained.

As shown in FIG. 2, the oscillation circuit 2 has a vibrator 21, a bias circuit 22, a first amplifier circuit 23, and a second amplifier circuit 24.

As shown in FIG. 3, the vibrator 21 is disposed on a substrate 211, and has a fixed electrode 212 and a movable electrode 213 formed on the substrate 211.

The movable electrode 213 has a support section 214 formed on the substrate 211, a movable plate (a movable section) 215 disposed across a gap from the fixed electrode 212, and a connecting section 216 for connecting the support section 214 and the movable plate 215 to each other. The movable plate 215 is cantilevered by the support section 214 via the connecting section 216.

The movable plate 215 has elasticity, and a predetermined spring constant, and can therefore vibrate elastically in the vertical direction in response to application of force in the vertical direction.

Further, when the pulses having a frequency equivalent to the natural frequency of the movable plate 215 are injected between the movable plate 215 and the fixed electrode 212, the movable plate 215 vibrates (resonates) to vary the capacitance between the fixed electrode 212 and the movable plate 215, thereby making a current flow, and as a result, a signal with the resonant frequency (the natural vibration frequency) is output (resonated) from the vibrator 21.

Further, a static (direct-current) voltage with a predetermined amplitude adjusted by the voltage adjustment circuit 4 is applied to the vibrator 21 via the bias circuit 22 as the bias voltage. Since the resonant frequency (hereinafter simply referred to also as the "resonant frequency of the vibrator 21") of the movable plate 215 of the vibrator 21 varies in accordance with the amplitude of the bias voltage applied between the fixed electrode 212 and the movable electrode 213, it is possible to set the resonant frequency of the vibrator 21 to be a desired value by appropriately controlling the amplitude of the bias voltage. In other words, although the vibrator 21 is tiny, and therefore the error with respect to the design size easily occurs to easily shift the resonant frequency from the desired value, the error in the resonant frequency with respect to the desired value can be corrected by setting the amplitude of the bias voltage as described above.

Because, the "apparent spring constant" of the movable plate 215 varies by applying the bias voltage between the fixed electrode 212 and the movable electrode 213. As shown in FIG. 4, the resonant frequency of the vibrator 21 drops, and the degree of the drop of the resonant frequency becomes larger, as the bias voltage applied between the fixed electrode 212 and the movable electrode 213 becomes higher. It should be noted that the oscillator 1 has the voltage adjustment circuit 4 equipped with a step-up circuit 41 described later, and therefore, can apply a relatively high bias voltage to the vibrator 21.

Further, in the case in which the bias voltage applied to the vibrator 21 is too high, the movable plate 215 is suctioned by the fixed electrode 212 to have contact therewith (pull-in). Therefore, the bias voltage is controlled to have amplitude falling within the range in which such a phenomenon does not occur.

As shown in FIG. 3, the first amplifier circuit 23 amplifies the signal output from the vibrator 21. The signal thus amplified is partially input to the second amplifier circuit 24, and at the same time, fed back and injected to the vibrator 21.

The second amplifier circuit 24 further amplifies the signal input from the first amplifier circuit 23. Subsequently, the signal (clock pulses φ) thus amplified by the second amplifier circuit 24 is output to the voltage adjustment circuit 4 and the external circuit 100.

The oscillation circuit 2 described above outputs the clock pulses in the manner described below. Firstly, when the bias voltage is input from the voltage adjustment circuit 4 to the vibrator 21 via the bias circuit 22 to thereby set the vibrator 21 into an operable state, and further the alternating-current signal including the resonant frequency component is injected into the vibrator 21, and an oscillation condition is satisfied in the closed loop including the vibrator 21 and the first amplifier circuit 23, the circuit starts to oscillate. A part of the signal generated by the oscillation is amplified by the second amplifier circuit 24, and then the clock pulses φ are output from the oscillation circuit 2. It should be noted that at the period of start-up of the oscillation circuit 2, the vibrator 21 starts to vibrate to flow an alternating current due to the fluctuation in the voltage applied to the vibrator 21 caused when first applying the bias voltage to the vibrator 21, and the alternating current is amplified by the first amplifier circuit 23 and then fed back to the vibrator 21. The alternating-current signal including the resonant frequency component and injected into the vibrator 21 is usually the alternating current thus fed back.

As shown in FIG. 1, the reference voltage supply circuit 3 generates the voltage (a reference voltage Vb) applied to the voltage adjustment circuit 4. It should be noted that although the applied voltage from the reference voltage supply circuit 3 is supplied only to the step-up circuit 41 as the reference voltage in FIG. 1, it is also possible to supply the reference voltage to other circuits (the oscillation circuit 2, the buffer circuits 5A, 5B, and so on) shown in the drawing in addition thereto.

The voltage adjustment circuit 4 has the step-up circuit 41 and the voltage divider circuit 42 disposed in the posterior stage of the step-up circuit 41.

The voltage adjustment circuit 4 converts the reference voltage Vb into a higher voltage Vo by the step-up circuit 41, and at the same time, converts the voltage Vo obtained by step-up operation of the step-up circuit 41 into a lower voltage Vp in the voltage divider circuit 42, thereby generating the static bias voltage Vp with which the resonant frequency of the vibrator 21 takes a desired value, and then supplies the oscillation circuit 2 with the static bias voltage Vp.

As shown in FIG. 5, the step-up circuit 41 has a clock generation circuit 411 and a charge pump circuit 412. As described above, the step-up circuit 41 converts the reference voltage Vb into the higher voltage Vo, and outputs the higher voltage Vo.

The clock generation circuit 411 generates normal phase clock pulses Vφ having a frequency and a phase identical to those of the clock pulses φ, and reverse phase clock pulses V¬φ, which are the same as the normal phase clock pulses Vφ except the phase being reversed from the phase of the clock pulses φ using the clock pulses φ generated in the oscillation circuit 2, and then inputs them into the charge pump circuit 412. The normal phase clock pulses Vφ and the reverse phase clock pulses V¬φ are both set to be 0 volt at L levels and Vb volt at H levels.

It should be noted that the symbol "¬" denotes reverse, namely the reverse phase against the normal phase. Further, the clock generation circuit 411 is supplied with a voltage corresponding to the potential difference between an electrical potential Vdd for driving the clock generation circuit 411 and the ground potential Vss, and operates using the voltage as the power.

The charge pump circuit 412 is a so-called Dickson charge pump circuit, and outputs the voltage Vo higher than the reference voltage Vb input thereto using the normal phase clock pulses Vφ and the reverse phase clock pulses V¬φ.

The charge pump circuit 412 is provided with five switching elements (diode-coupled NMOS) MD1, MD2, MD3, MD4, and MD5 connected serially, four capacitors C1, C2, C3, and C4 having one terminals respectively connected to the nodes of the switching elements MD1 through MD5, and a capacitor $C_{out}$ having one terminal connected to the output of the final switching element MD5 out of these switching elements MD1 through MD5. Further, the other terminals (the lower side in the drawing) of the capacitors C1, C3 are connected to the clock generation circuit 411 so that the normal phase clock pulses Vφ are input thereto, and the other terminals (the lower side in the drawing) of the capacitors C2, C4 are connected to the clock generation circuit 411 so that the reverse phase clock pulses V¬φ are input thereto. Further, the reference voltage Vb to be stepped up is input from the input of the switching element MD1, and the voltage Vo obtained by the step-up operation is output from the output of the switching element MD5.

In such a circuit, when the normal phase clock pulses Vφ take the L level (0 volt) and the reverse phase clock pulses V¬φ take the H level (Vb volt), since the potentials of the other terminals of the capacitors C1, C3 become 0 volt, and the potentials of the other terminals of the capacitors C2, C4 become Vb volt, the switching elements MD1, MD3 become in a conduction state, and at the same time, the switching elements MD2, MD4 become in a blocking state. Therefore, the current caused by a voltage (Vb-VF) corresponding to the reference voltage Vb input thereto flows into the capacitor C1, on the one hand, and the capacitors C2, C4 become to have the potentials obtained by adding Vb volt thereto, and the currents caused by the potentials flow into the capacitors C3, $C_{out}$ in the posterior stage thereof, respectively, on the other hand. Here, the reference symbol VF denotes the forward voltage drop caused when the current passes through each of the switching elements MD1 through MD5.

In contrast, when the normal phase clock pulses Vφ take the H level (Vb volt) and the reverse phase clock pulses V¬φ take the L level (0 volt), since the potentials of the other terminals of the capacitors C2, C4 become 0 volt, and the potentials of the other terminals of the capacitors C1, C3 become Vb volt, the switching elements MD2, MD4 become in the conduction state, and at the same time, the switching elements MD1, MD3 become in the blocking state. Therefore, the currents caused by the capacitors C1, C3 each having the potential increasing as much as the voltage Vb flow into the capacitors C2, C4 in the posterior stages thereof, respectively.

Due to the switching operation by the switching elements MD1 through MD4 and the charge and discharge operations by the capacitors C1 through C4 and $C_{out}$ described above, the capacitor C2 is charged to be the voltage (2Vb-2VF) approximately two times as high as the input voltage Vb, the capacitor C3 is charged to be the voltage (3Vb-3VF) approximately three times as high as the reference voltage Vb, and the capacitor C4 is charged to be the voltage (4Vb-4VF) approximately four times as high as the reference voltage Vb, and further, the final capacitor $C_{out}$ is charged to be the voltage (5Vb-5VF) approximately five times as high as the input voltage Vb. Thus, it becomes possible to take out the output voltage of about 5 Vb volt, and output it to the voltage divider circuit 42.

Such a step-up circuit 41 as described above converts the reference voltage Vb into a higher voltage using the clock pulses φ output from the oscillation circuit 2. As described above, since the step-up circuit uses the clock pulses φ output from the oscillation circuit 2, it becomes possible to eliminate the necessity of obtaining the clock pulses from the outside of the oscillator 1, and therefore, in the oscillator 1 only the clock pulses derived from the oscillation circuit 2 are used. As a result, deterioration in the clock pulses φ output from the oscillation circuit 2 due to, for example, the interference between the external clock pulses and the clock pulses of the vibrator 21 is prevented. Further, since there is no need to provide another vibrator in the oscillator 1, the oscillator 1 can be simplified, and the chip size of the oscillator 1 or the semiconductor substrate on which the oscillator 1 is mounted becomes smaller.

It should be noted that the charge pump circuit 412 can be changed in the level of the output voltage Vo according to needs. For example, it is possible to take out a voltage of a node between the capacitor C1 and the switching element MD2, a voltage of a node between the capacitor C2 and the switching element MD3, and a voltage of a node between the capacitor C3 and the switching element MD4, and set the output voltage Vo to be these voltages (the circuit thereof is not shown). Further, in the case in which the stepping-up is not required, it is possible to set the output voltage Vo to be the voltage taken out from the input of the switching element MD1 (the circuit thereof is not shown).

As described above, the voltage divider circuit 42 converts the voltage Vo thus stepped up by the step-up circuit 41 into the lower voltage Vp, and then inputs the lower voltage Vp into the oscillation circuit 2.

As shown in FIG. 6, the voltage divider circuit 42 is a resistor voltage divider circuit, and is provided with resistors R1, R2, R3, and R4 connected serially, and switches SW1, SW2.

The switch SW1 can connect the line connecting the resistor R1 and the resistor R2 and the line connecting the resistor R2 and the resistor R3. The switch SW2 can connect the line connecting the resistor R2 and the resistor R3 and the line connecting the resistor R3 and the resistor R4.

Further, due to the relationship between the resistance value of the resistor R1 and the total resistance value of the resistors used out of the resistors R2 through R4, the voltage divider circuit 42 divides (drops) the voltage Vo input from an input terminal located above the resistor R1, and outputs the result to the oscillation circuit 2 as the bias voltage Vp output from a node between the resistor R1 and the resistor R2.

It should be noted that since the resistor R2 can be shorted by turning on the switch SW1, and the resistor R3 can be shorted by turning on the switch SW2, and thus the total resistance value of the resistors used among the resistors R2 through R4 can be varied, the bias voltage Vp can arbitrarily be controlled.

It should be noted that although the example of having the four resistors and the two switches is cited in the drawing, the invention is not necessarily limited thereto. For example, it is also possible to provide a necessary number (e.g., 8) of resistors for assuring a necessary resolution, and to provide a necessary number (e.g., 6) of switches for switching the resistors. Further, the position of the output to the supply terminal for the oscillation circuit 2 is not limited to the mid point of the resistor R1 and the resistor R2 as shown in the drawing, but can be an appropriate node of the resistors used therein. What is important is to provide the function capable of outputting an appropriate potential in accordance with the voltage to be supplied to the oscillation circuit 2.

The buffer circuit 5A is a buffer amplifier, and is disposed between the oscillation circuit 2 and the step-up circuit 41. The clock pulses φ output from the oscillation circuit 2 and input to the step-up circuit 41 pass through the buffer circuit 5A. Further, the buffer circuit 5A prevents an influence exerted on the mutual operations between the step-up circuit 41 and the oscillation circuit 2.

The buffer circuit 5B is a buffer amplifier, and is disposed between the oscillation circuit 2 and the external circuit 100. The clock pulses φ output from the oscillation circuit 2 and input to the external circuit 100 pass through the buffer circuit 5B. Further, the buffer circuit 5B prevents an influence exerted on the mutual operations between the external circuit 100 and the oscillation circuit 2.

It should be noted that the buffer circuits 5A, 5B can also be eliminated.

Further, although not shown in the drawing, in the case of connecting the reference voltage supply circuit 3, the step-up circuit 41, and the voltage divider circuit 42 to each other, mutual interference might be concerned. In this case, it is also possible to make a buffer circuit lie in each of the connections.

The oscillator 1 having the configuration described above can control the bias voltage input to the oscillation circuit 2 since the voltage adjustment circuit 4 is provided, and therefore, can oscillate at a desired resonant frequency even in the case in which the manufacturing error in the frequency characteristic is caused in the vibrator 21. In particular, by using the clock pulses $\phi$ generated by the oscillation circuit 2 as the clock pulses used by the step-up circuit 41, the deterioration (e.g., incoming noise) in the clock pulses $\phi$ output by the oscillation circuit 2 can be prevented compared to the case of using the external clock pulses. Further, since the external clock pulses are not used, it becomes possible to eliminate the necessity of providing the oscillation circuit outside the oscillator 1, and thus the circuit on the semiconductor substrate can be simplified.

Further, the graph shown in FIG. 7 shows the temporal variations of the output voltage Vo of the step-up circuit 41 and the resonant frequency fr of the vibrator 21 when the oscillator 1 described above starts the operation.

The output voltage Vo of the step-up circuit 41 does not become the target level immediately after the oscillator 1 is started, but the initial output voltage is the reference voltage Vb. Then, the output voltage Vo rises in predetermined time, and becomes in a steady state at the time point when it reaches the target level.

Incidentally, the resonant frequency fr of the vibrator 21 varies in accordance with the bias voltage Vp as described above. At the beginning of the operation of the oscillator 1, since the output voltage Vo from the step-up circuit 41 is low, the bias voltage Vp is kept low, and the resonant frequency fr becomes high. Subsequently, the resonant frequency fr is lowered as the output voltage Vo from the step-up circuit 41 rises, and the resonant frequency fr becomes constant at the time point when the output voltage Vo becomes constant.

Second Embodiment

An oscillator according to a second embodiment of the invention will hereinafter be explained.

Figure 8:
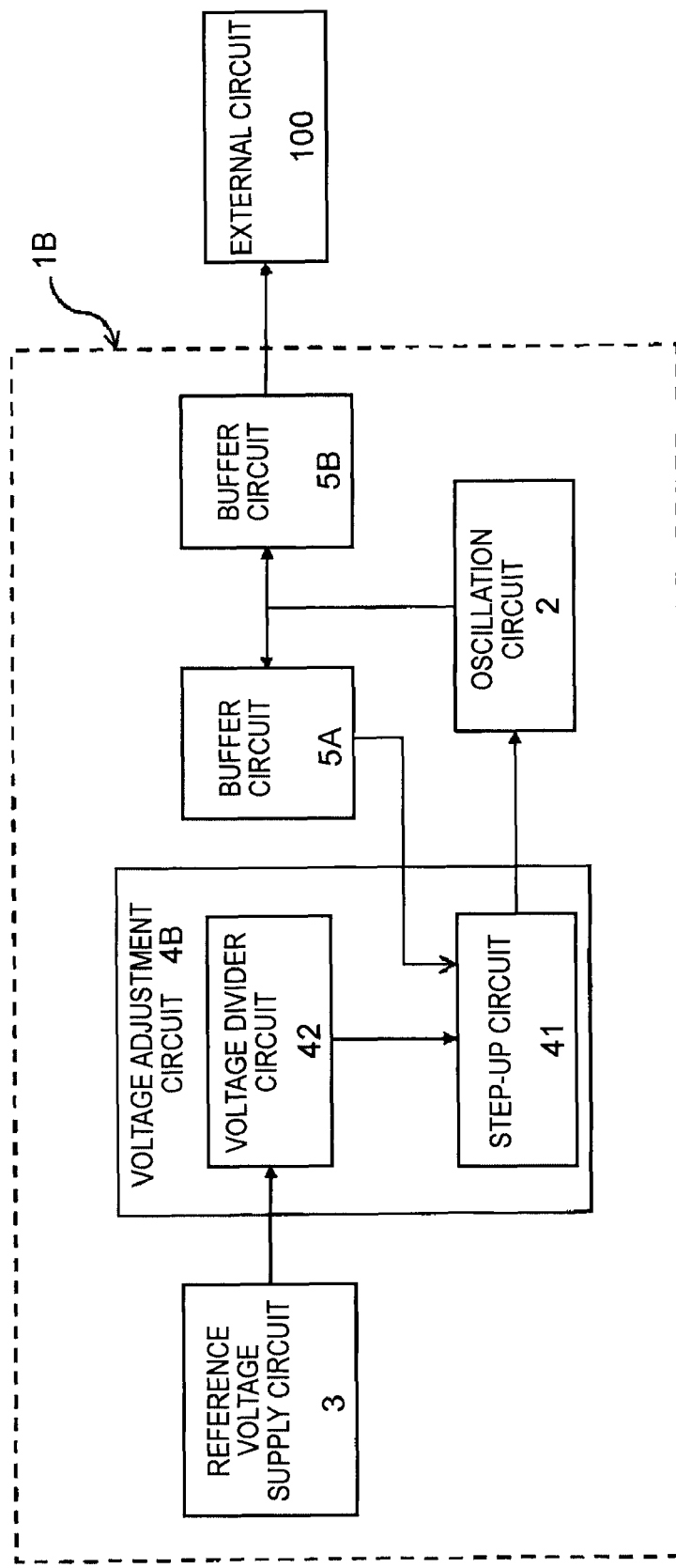
FIG. 8 is a block diagram of an oscillator according to a second embodiment of the invention.

FIG. 8 is a block diagram of the oscillator according to the second embodiment of the invention.

Hereinafter, the second embodiment will be described with a focus mainly on the differences from the first embodiment described above, and the explanations regarding the common matters will be omitted. It should be noted that the constituents identical to those of the first embodiment described above are denoted by the same reference symbols.

The oscillator 1B according to the second embodiment of the invention is substantially the same as that of the first embodiment except the configuration of the voltage adjustment circuit 4B, which is different from that of the first embodiment.

In the present embodiment, although the voltage adjustment circuit 4B has the step-up circuit 41 and the voltage divider circuit 42, the order of the processes of the reference voltage Vb input thereto is different. Specifically, the reference voltage Vb from the reference voltage supply circuit 3 is input to the voltage divider circuit 42. Then, in the voltage divider circuit 42, the reference voltage Vb is converted into a lower voltage Vo' and then the lower voltage Vo' is output. Subsequently, the voltage Vo' output by the voltage divider circuit 42 is input to the step-up circuit 41 to be converted into a higher voltage Vp, and then the voltage Vp is output.

Then, the voltage Vp output from the step-up circuit 41 is input to the oscillation circuit 2 as the bias voltage Vp.

According also to the second embodiment described above, substantially the same advantage as in the first embodiment can be obtained.

Third Embodiment

An oscillator according to a third embodiment of the invention will hereinafter be explained.

Figure 9:
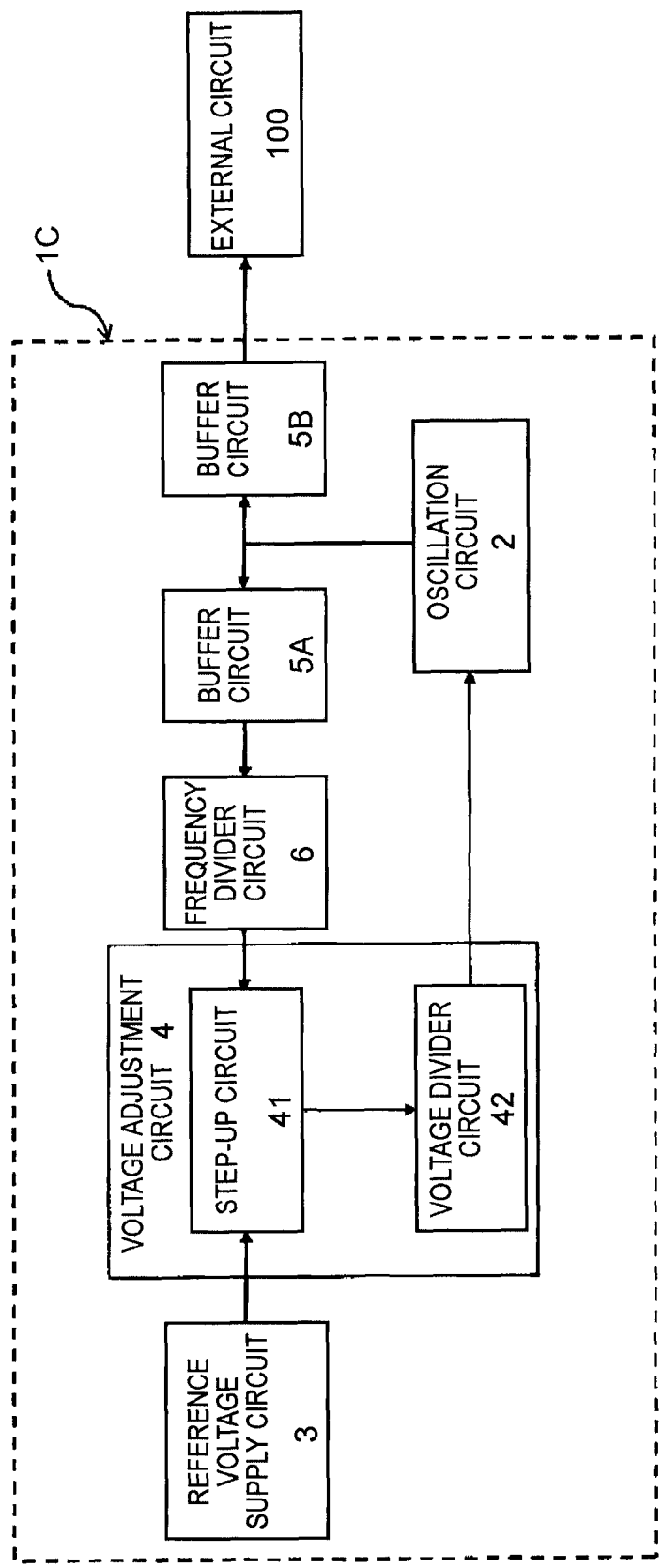
FIG. 9 is a block diagram of an oscillator according to a third embodiment of the invention.
Figure 10A:
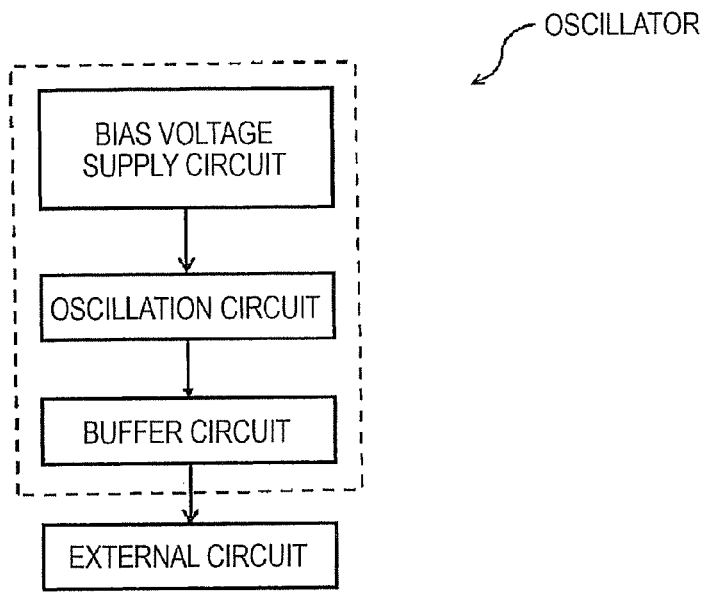
FIGS. 10A and 10B are respectively a block diagram showing an example of an oscillator as an embodiment of the related art and a circuit diagram showing an example of an oscillation circuit provided to the oscillator.
Figure 10B:
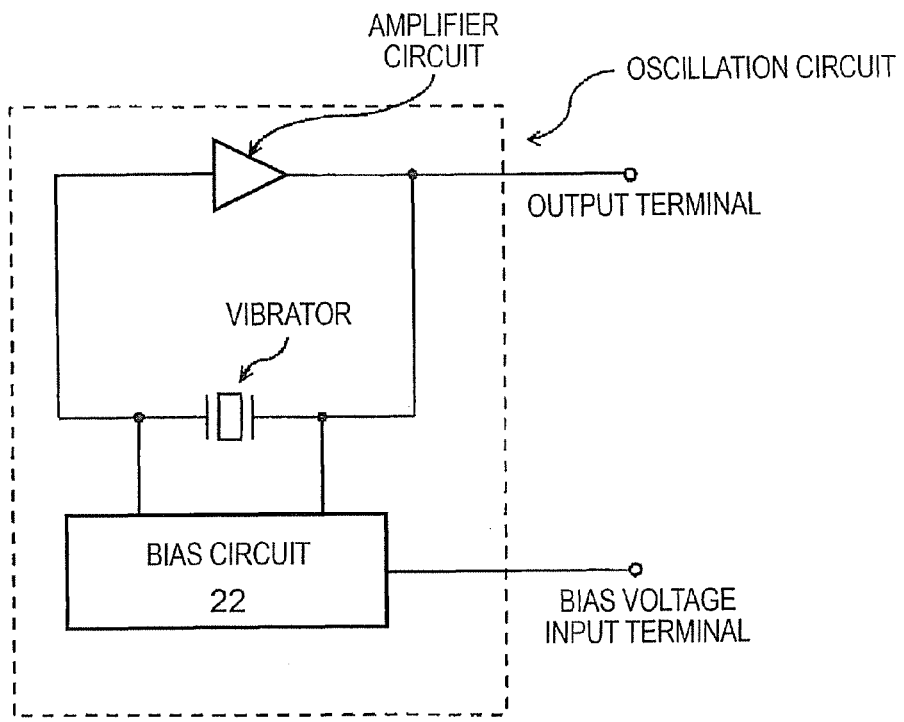
Figure 11:
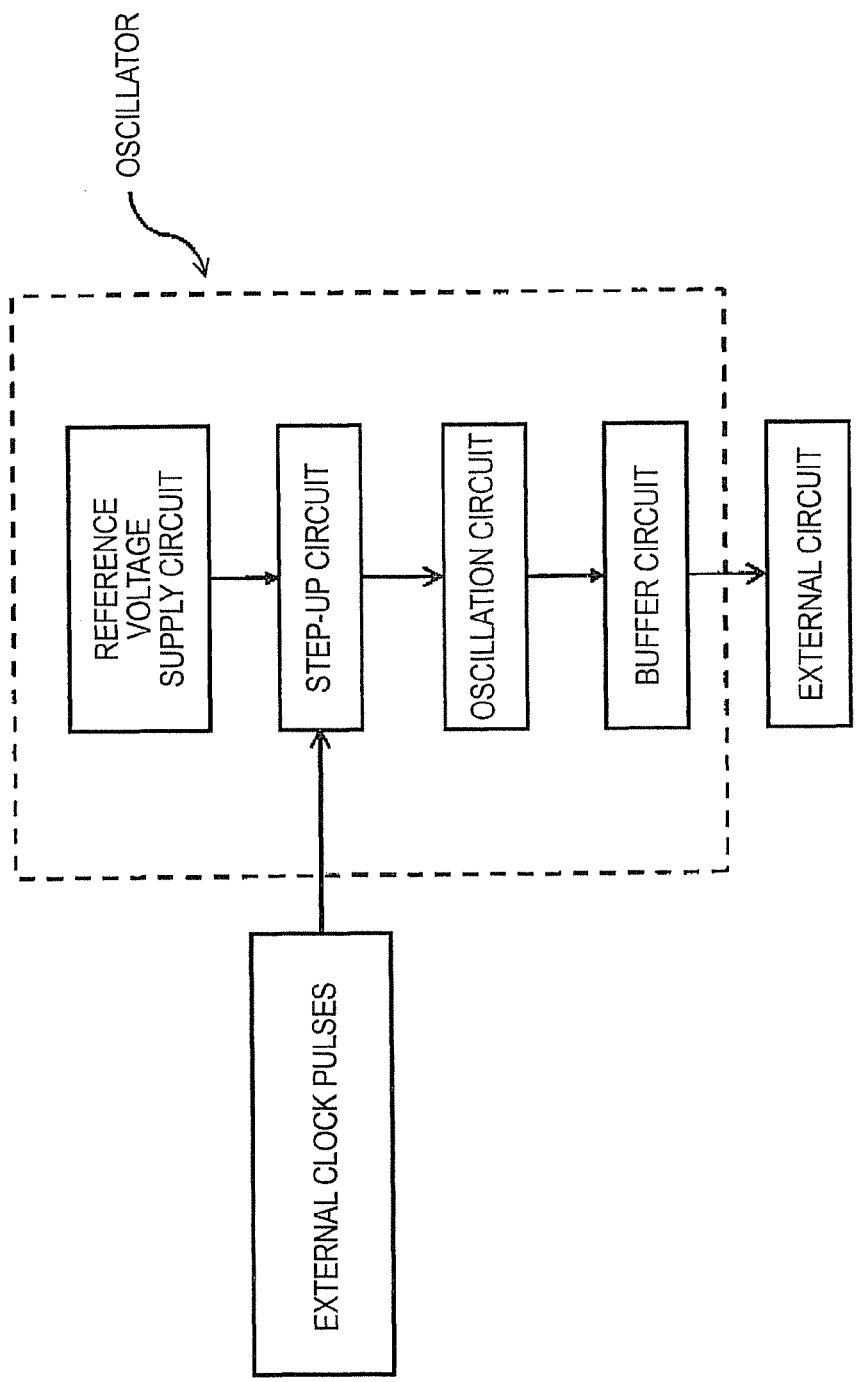
FIG. 11 is a block diagram showing an example of an oscillator as an embodiment of the related art.

FIG. 9 is a block diagram of the oscillator according to the third embodiment of the invention.

Hereinafter, the third embodiment will be described with a focus mainly on the differences from the embodiments described above, and the explanations regarding the common matters will be omitted. It should be noted that the constituents identical to those of the first embodiment described above are denoted by the same reference symbols.

The oscillator 1C according to the third embodiment of the invention is substantially the same as that of the first embodiment except the fact that a frequency divider circuit 6 is disposed between the buffer circuit 5A and the step-up circuit 41.

The frequency divider circuit 6 converts the clock pulses $\phi$ input from the oscillation circuit 2 via the buffer circuit 5A into clock pulses $\phi'$ with a lower frequency, and then outputs the clock pulses $\phi'$. Specifically, in the frequency divider circuit, the clock pulses $\phi'$ with a frequency obtained by dividing the frequency of the clock pulse $\phi$ by an integer (1/n) is generated using the frequency of the clock pulse $\phi$.

The clock pulses $\phi'$ output from the frequency divider circuit 6 are input into the step-up circuit 41, and are used for the conversion of the reference voltage Vb. According to the configuration described above, even in the case in which, for example, the frequency of the clock pulses $\phi$ output from the oscillation circuit 2 is too high for the step-up circuit 41 to operate preferably, the step-up circuit 41 operates preferably by using the clock pulses $\phi'$ with a lower frequency generated by the frequency divider circuit 6.

It should be noted that in such a case, although the two types of clock pulses (the clock pulses $\phi$ and the clock pulses $\phi'$) with different frequencies exist in the oscillator 1, since the frequency of the clock pulses $\phi'$ is obtained by dividing the frequency of the clock pulses $\phi$ by an integer, the deterioration of the clock pulses $\phi$ can be prevented.

According also to the third embodiment described above, substantially the same advantage as in the first embodiment can be obtained.

Although the oscillators according to the invention are described based on the respective embodiments shown in the accompanying drawings as described above, the present invention is not limited to these embodiments, but the configuration of each of the components can be replaced with one having an identical function and any configuration. Further, it is possible to add any other constituents. Further, the oscillator according to the invention can be a combination of any two or more configurations (features) out of the embodiments described above.

For example, although in the embodiments described above, a vibrator having the cantilevered movable electrode is used as the vibrator, the invention is not limited thereto, but a vibrator having the movable electrode supported on both ends, or various vibrators driven by the electrostatic attractive force and capable of vibrating elastically, such as an electrostatic comb drive actuator can be used.

The entire disclosure of Japanese Patent Application No. 2009-075907, filed Mar. 26, 2009 is expressly incorporated by reference herein.

What is claimed is:

1. An oscillator, comprising:
a vibrator having a first electrode and a second electrode disposed with a gap with the first electrode;
a reference voltage supply circuit adapted to supply a reference voltage; and
a voltage adjustment circuit having a step-up circuit operating in response to input of clock pulses and adapted to convert the reference voltage into a voltage of a predetermined level and to output the voltage of the predetermined level,
wherein the vibrator is configured so as to apply the voltage of the predetermined level, which is output from the voltage adjustment circuit, between the first electrode and the second electrode, and
the clock pulses to be input into the step-up circuit are obtained using the vibrator as a source.

2. The oscillator according to claim 1, wherein
the first electrode is a fixed electrode, and
the second electrode is a movable electrode.

3. The oscillator according to claim 1, wherein
a level of the voltage output from the voltage adjustment circuit is adjusted to be the predetermined level, thereby setting a resonant frequency of the vibrator to be within a predetermined numerical range.

4. The oscillator according to claim 1, further comprising:
an oscillation circuit adapted to generate the clock pulses based on the vibration of the vibrator, and to output the clock pulses to the step-up circuit and externally.

5. The oscillator according to claim 4, further comprising:
a buffer circuit disposed between the oscillation circuit and the step-up circuit, and adapted to transmit the clock pulses.

6. The oscillator according to claim 1, wherein
the voltage adjustment circuit has a voltage divider circuit,
the voltage divider circuit converts the reference voltage into a lower voltage and outputs the lower voltage to the step-up circuit, and
the step-up circuit converts the voltage, which is input from the voltage divider circuit, into a higher voltage, and outputs the higher voltage as the voltage of the predetermined level.

7. The oscillator according to claim 1, wherein
the voltage adjustment circuit has a voltage divider circuit,
the step-up circuit converts the reference voltage into a higher voltage and outputs the higher voltage to the voltage divider circuit, and
the voltage divider circuit converts the voltage, which is input from the step-up circuit, into a lower voltage, and outputs the lower voltage as the voltage of the predetermined level.

8. The oscillator according to claim 1, further comprising:
a frequency divider circuit adapted to divide frequency of the clock pulses obtained using the vibrator as a source, and to input the clock pulses with the divided frequency into the step-up circuit.

* * * * *